United States Patent [19]

Kim

[11] Patent Number: 5,407,864
[45] Date of Patent: Apr. 18, 1995

[54] PROCESS FOR MOUNTING A SEMICONDUCTOR CHIP AND DEPOSITING CONTACTS INTO THROUGH HOLES OF A CIRCUIT BOARD AND OF AN INSULATING INTERPOSER AND ONTO THE CHIP

[75] Inventor: Gu-Sung Kim, Suwon, Rep. of Korea

[73] Assignee: Samsung Electronics Co., Ltd., Suwon, Rep. of Korea

[21] Appl. No.: 95,375

[22] Filed: Jul. 23, 1993

[30] Foreign Application Priority Data

Jul. 24, 1992 [KR] Rep. of Korea ............... 92-13308

[51] Int. Cl.⁶ .................. H01L 21/283; H01L 21/58; H01L 21/60
[52] U.S. Cl. ................................. 437/203; 437/209; 257/698; 257/778; 257/783; 361/767
[58] Field of Search ................. 437/203, 209, 974; 257/698, 778, 783; 29/840, 845; 228/180.21, 180.22

[56] References Cited

U.S. PATENT DOCUMENTS

| | | | |
|---|---|---|---|
| 4,754,371 | 6/1988 | Nitta et al. | 361/411 |
| 4,879,258 | 11/1989 | Fisher | 437/225 |
| 4,918,811 | 4/1990 | Eichelberger et al. | 29/840 |
| 5,111,279 | 5/1992 | Pasch et al. | 257/778 |
| 5,157,589 | 10/1992 | Cole, Jr. et al. | 257/700 |
| 5,171,712 | 12/1992 | Wang et al. | 437/183 |

FOREIGN PATENT DOCUMENTS 63-93124 4/1988 Japan ...................... 437/209

OTHER PUBLICATIONS

"LSI Package Design", *IBM Technical Disclosure Bulletin;* vol. 32, No. 8A, Jan. 1990, pp. 178 & 179.

*Primary Examiner*—Olik Chaudhuri
*Assistant Examiner*—David E. Graybill
*Attorney, Agent, or Firm*—Charles R. Donohoe; Robert A. Westerlund, Jr.; Stephen R. Whitt

[57] ABSTRACT

A process of manufacturing a semiconductor chip that has a connecting pad and is connected to a front side of a circuit board that has a conductive trace connected to a through-hole. An insulating adhesive layer, which has a hole corresponding to the pad, is interposed between the chip and the board so that the pad, the hole in the insulating layer and the through-hole in the board are aligned. A conductive material is applied into the through-hole from the back side of the board so as to fill the through-hole and connect the pad to the trace. The conductive material may be applied using a sputtering method, a screening method, an electroplating method or an evaporating method. The back side of the board is polished to remove conductive material which may have been applied on the back side of the board outside the through-hole.

14 Claims, 3 Drawing Sheets

PROCESS FOR MOUNTING A SEMICONDUCTOR CHIP AND DEPOSITING CONTACTS INTO THROUGH HOLES OF A CIRCUIT BOARD AND OF AN INSULATING INTERPOSER AND ONTO THE CHIP

BACKGROUND OF THE INVENTION

The present invention relates to semiconductor packaging. More particularly, the present invention relates to a method for mounting a semiconductor chip with high density in accordance with an improved flip-chip method and a product obtained therefrom.

DESCRIPTION OF THE RELATED ART

Chips separated from a wafer are packaged by being appropriately connected to outer leads so as to be conveniently utilized for very large scale circuits or systems. In general, the chip is mounted on a lead frame. Contact pads on the chip are connected to the leads by wire-bonding.

Recently, electronic devices have been developed with various functions and large capacity. In response to these trends, surface mount semiconductor integrated circuits have been developed with multiple pins, high speed and high reliability.

Tape automated bonding (TAB), a technique by which an integrated circuit chip can be directly bonded to a lead frame, has been partly employed. To shorten the time spent in individually connecting the leads to each pad on the chip, a simultaneous adhering technique known as the flip-chip method has been developed.

In the conventional flip-chip method, bumps made of soldering lead or a special alloy are formed on each contact pad to a height of about 80 μm from the integrated circuit (IC) chip surface. When the chip is inverted, the bumps are aligned with metallized traces formed on the board. The bumps are attached to corresponding connection points on the board by a supersonic attachment method or an alloy soldering method. This method has an advantage that all contacts can be made simultaneously.

FIG. 1 is a sectional view showing the flip-chip method utilized in the conventional art. The board in this FIGURE is provided with traces 3, 3', 3" formed on both sides and is a multilayered board where these traces are connected by a through-hole connection 4. The nearly circular bumps 2 are formed on the semiconductor chip 1 by evaporating solder on the chip pad (not shown), electroplating or dipping the solder. The traces are formed in advance on the board having connection positions corresponding to the positions of the chip pads. When the chip is to be mounted on the board, the chip with the bumps is inverted, as shown in FIG. 1, to be aligned with the traces formed on the board. Heat treatment being performed, the solder (bump) is melted to join the chip pad to the traces. An epoxy is applied and hardened between the chip and the board, and then the overall surface of the chip is sealed by a protective resin to protect the semiconductor from external conditions.

In general, though the flip-chip method has many advantages, this method has problems of a complicated process and a high cost associated with steps of putting the solder on the chip (to make the bump), sealing and the like.

SUMMARY OF THE INVENTION

An object of the present invention is to provide a high density method for mounting semiconductor chips with enhanced manufacturing characteristics, and products made using the method.

In a first embodiment of the present invention, a semiconductor chip is connected to a board that has a through-hole aligned with the contact pad, including the steps of: interposing an adhesive layer having a hole between the chip and the board with alignment of the chip pad, the hole in the adhesive layer and the through-hole; applying a conductive material through the back of the through-hole to connect the pad to the trace; and further filling the through-hole with insulating material.

Further, the present invention provides the product obtained from the present method including: a semiconductor chip having a connecting pad on one side; a board having the conductive trace connected to the through-hole and extended to the surroundings of the through-hole; an adhesive layer interposed between the chip and the board; a conductive layer formed on the inner wall of the through-hole and connecting the pad to the conductive trade; and an insulating layer further filling the through-hole.

BRIEF DESCRIPTION OF THE DRAWINGS

Further objects and other advantages of the present invention will be apparent from the detailed description of the present invention in connection with the accompanying drawings.

DESCRIPTION OF THE PREFERRED EMBODIMENTS

One preferred embodiment according to the present invention is described in greater detail below.

FIGS. 2A to 2F are sectional diagrams showing a process for mounting a semiconductor chip according to the present invention.

Figure 1:
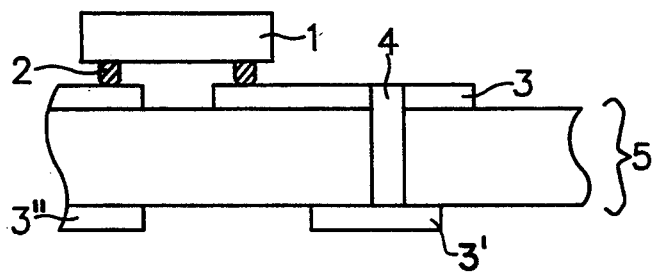
FIG. 1 is a sectional view showing a method for mounting a semiconductor chip using a conventional flip-chip method.
Figure 2A:
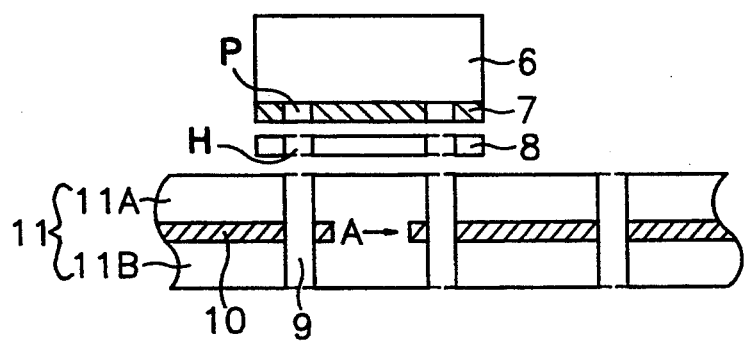
FIGS. 2A to 2F are sectional diagrams showing a process for mounting a semiconductor chip according to a first embodiment of the present invention.

As shown in FIG. 2A, a metal pad P for connecting other components or signal line and a polyamide layer 7 for insulation and pattern protection are provided on one side of the semiconductor chip 6.

Figure 2B:
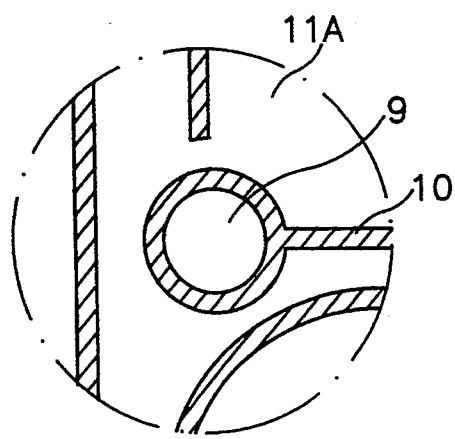

A multilayered printed circuit board (PCB) 11 includes a first insulating layer 11A and a second insulating layer 11B. As shown in FIG. 2B, patterned conductive traces are formed between these layers. A two-layered board with conductive traces provided therebetween is used as an example in this embodiment of the present invention. Of course, the PCB 11 may have additional layers. The PCB 11 includes a through-hole 9 through which the interlaid conductive traces 10 or electric components may be interconnected to one another. FIG. 2B is an enlarged view of the surroundings of the through-hole of the traces 10. It can be seen that a circular through-hole 9 is formed on the board and a part of the trace 10 is formed on the through-hole and extends to the surroundings thereof. The PCB 11 with the conductive traces 10 is designed in advance by a well-known method.

The chip 6 and the PCB 11 are prepared and then bonded to each other as follows.

The pad P of the chip 6 and the through-hole 9 of the PCB 11 are made in advance to align the pad P with the through-hole.

Figure 2C:
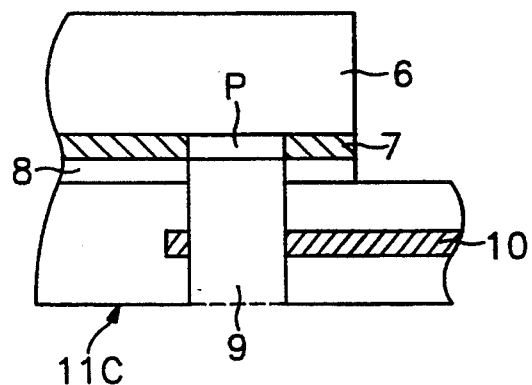

With alignment of the pad P and the through-hole as shown in FIG. 2A, an adhesive material is interposed between the chip 6 and the PCB 11 to form an adhesive layer 8. Adhesive layer 8 is an epoxy resin having a gel state upon initial application. This is necessary because a conventional liquid state epoxy would undesirably penetrate through the through-hole 9. Such a gelatin epoxy can be purchased from "Ablestik Inc." or "Zymet, Inc." in the United States. The sheet film which is more or less hardened and is formed to have a hole H corresponding to the pad P acting as a mask. It is noted that the film type adhesive material is processed to prevent the periphery of the pad from being stained with a glue. As shown in FIG. 2C, mounting of the chip 6 on the PCB 11 to which the adhesive 8 has been applied results in the pad P of the chip 6 being exposed within the now closed surface at the upper end of the through-hole 9.

Figure 2D:
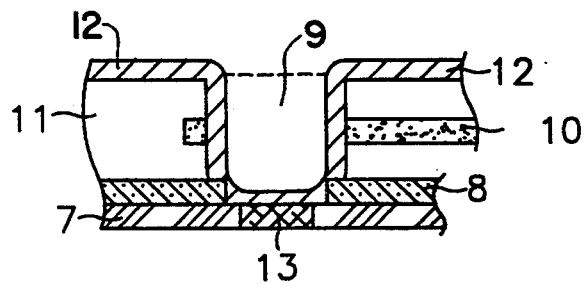

After mounting of chip 6, a conductive layer 12 is formed on the inside surface of the through-hole, so that the pad P and the traces 10 are electrically interconnected by the conductive layer. FIG. 2D shows, in an inverted sectional view, the assembly of FIG. 2C after application of the conductive layer.

The conductive layer 12 formed on the back side of the board, the inner wall of the through-hole and the metal pad P as shown in FIG. 2D, is formed by depositing a conductive material such as gold (Au) or Nickel (Ni) or an alloy by sputtering, screening, electroplating or evaporation. Thus, the conductive traces 10 interposed between the insulating layers of the board and the metal pad P of the chip are connected by the conductive layer 12.

Figure 2E:
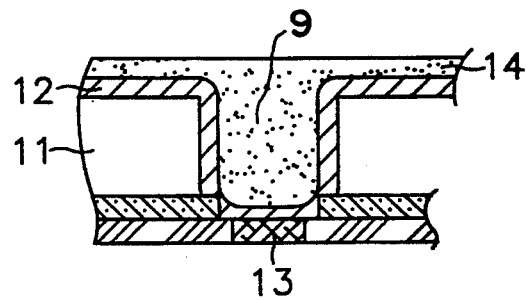
Figure 2F:
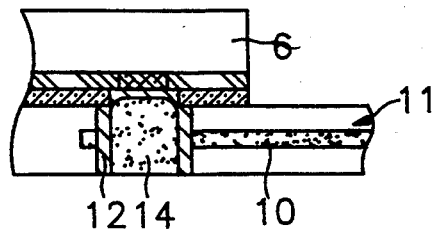

As shown in FIG. 2E, an insulating material such as an epoxy or a polyamide is deposited on the back side of the board and further fills the through-hole 9 to form an insulating layer 14. After curing and then securing the buried insulating material, the insulating layer 14 and the conductive layer 12 are removed —except in the through-hole—by polishing to expose the back side surface of the board. Thus, as shown in FIG. 2F, an improved chip mounting assembly by a flip-chip method can be obtained therefrom.

Although the example shown in the drawings has insulate and conductive material deposited over an entire extent of the PCB, it should be appreciated that some deposition techniques, such as screening, will confine deposition more locally around the through-holes.

Figure 3:
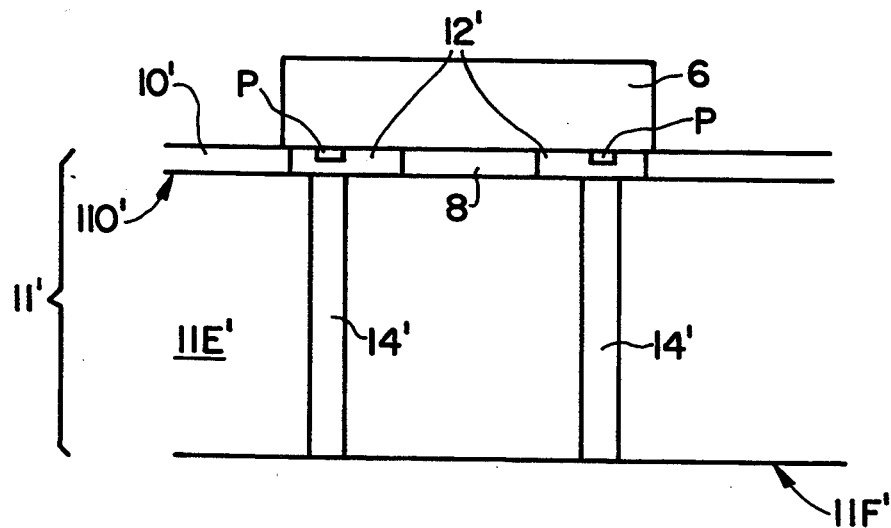
FIGS. 3 and 4 illustrate a process for mounting a semiconductor chip according to a second embodiment of the present invention.
Figure 4:
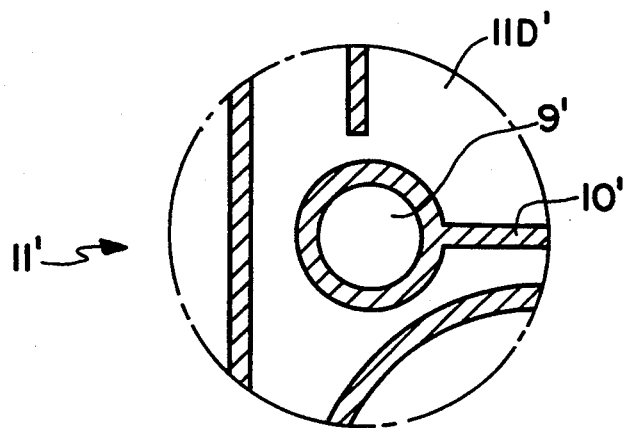

There will be disclosed another preferred embodiment of the present invention with reference to FIGS. 3 and 4.

In FIG. 3, PCB 11' has a conductive pattern 10' formed on an upper or lower surface. Thus, a conductive pattern 10' is formed on the PCB where the chip 6 is to be mounted. The conductive pattern is formed on one side 11D' of the insulating material. A through-hole 9' is formed through the insulating material 11E', from sides 11D' to 11F' aligned with each pad P A top view of the PCB 11' by this pad P area is shown in FIG. 4. Film type insulating adhesive layer 8, in which the holes H are formed on the corresponding position to each chip pad P, is interposed between the chip 6 and the board 11' as in the previous embodiment so as to align each pad P of the chip, each hole of the film H and each through-hole 9'. Once the adhesive 8 is placed onto the PCB 11' the chip 6 is attached to PCB 11' After that, conductive layer 12' is formed around the metal pads P of the chip using the through-holes 9' at the base side opposite to the upper side of the board to which the chip is attached to insert the conductive layer 12' so that each pad P and the conductive traces 10' are interconnected. The insulating material 14' is then added in the through-holes 9' to fill each through hole 9'. After hardening the material, the insulation 14' on the base side 11F' of the board and the conducting layer 12' on the base side 11F' are removed by polishing, thereby completing this embodiment of the present invention.

A conventional flip-chip method has a problem such that the chip is heated and pressed to melt a bump. However, the present invention can omit such steps and so does not need equipment for performing such steps, resulting in the reduced cost and the improved reliability.

Also, the present invention has advantages of simply mounting the chip and easily forming the conductive layer. Further, the present invention makes a thin structure and an advantageous connection method is possible.

Although preferred embodiments of this invention have been described in detail, it should be clearly understood that many variations or modifications of the basic inventive concepts taught here will still fall within the spirit and scope of the present invention, as defined in the appended claims.

What is claimed is:

1. A method for attaching a contact pad of a semiconductor chip to a conductive trace connected to a through-hole on a board, comprising steps of:
   aligning the contact pad of the semiconductor chip with the through-hole on the board;
   interposing an adhesive layer between the chip and a proximal side of the board, the adhesive layer having a hole aligned with the contact pad of the semiconductor chip and with the through-hole of the board;
   applying a conductive material into the through hole and on to the pad, the conductive material partially filling the through hole and connecting the pad to the conductive trace; and
   further filling the partially filled through-hole with an insulating material.

2. A method according to claim 1, wherein the step of applying the conductive material applies the conductive material into the through hole and on to tile pad through a distal side of the board.

3. A method according to claim 2, further comprising a step of removing conductive material applied to the distal side of the board outside the through hole.

4. A method according to claim 1, further comprising a step of hardening the insulating material.

5. A method according to claim 1, further comprising a step of:
   hardening the insulating material;
   wherein the step of applying the conductive material applies the conductive material into the through-hole and on to the pad through a distal side of the board.

6. A method according to claim 5, further comprising a step of:
   removing insulating material and conductive material applied to the distal side of the board outside the through hole by polishing until the board has been exposed.

7. A method according to claim 1, further comprising a step of providing the board as a multi-layer board having the conductive trace interposed between two insulating layers.

8. A method according to claim 1, further comprising a step of providing the conductive trace connected to the through-hole at a surface of the board.

9. A method according to claim 1, wherein the step of applying the conductive material applies conductive material by one method selected from: a sputtering method, a screening method, an electroplating method and an evaporating method.

10. A method according to claim 1, wherein the conductive material includes gold.

11. A method according to claim 1, wherein the conductive material includes nickel.

12. A method according to claim 1, wherein the insulating material includes an epoxy.

13. A method according to claim 1, wherein the insulating material includes a polyamide.

14. A method for attaching a contact pad of a semiconductor chip to a conductive trace connected to a through-hole on a board, comprising the steps of:
   aligning the contact pad of the semiconductor chip with the through-hole on the board;
   interposing an adhesive layer between the chip and a proximal side of the-board, the adhesive layer having a hole aligned with the contact pad of the semiconductor chip and with the through-hole of the board;
   adhering the semiconductor chip to the board with the contact pad of the semiconductor chip aligned with the through-hole of the board;
   applying a conductive material into the through hole and on to the pad from a distal side of the board, the conductive material filling the through hole and connecting the pad to the conductive trace.

* * * * *